(12) United States Patent
Visintin et al.

(10) Patent No.: US 10,544,307 B2
(45) Date of Patent: Jan. 28, 2020

(54) CHLORINATED COPPER PHTHALOCYANINE PIGMENTS

(71) Applicant: Sun Chemical Corporation, Parsippany, NJ (US)

(72) Inventors: Pamela M. Visintin, Charleston, SC (US); Russell J. Schwartz, Cincinnati, OH (US)

(73) Assignee: Sun Chemical Corporation, Parsippany, NJ (US)

( * ) Notice: Subject to any disclaimer, the term of this patent is extended or adjusted under 35 U.S.C. 154(b) by 119 days.

(21) Appl. No.: 15/578,771

(22) PCT Filed: Jun. 2, 2016

(86) PCT No.: PCT/US2016/035392
§ 371 (c)(1),
(2) Date: Dec. 1, 2017

(87) PCT Pub. No.: WO2016/196715
PCT Pub. Date: Dec. 8, 2016

(65) Prior Publication Data
US 2018/0215921 A1   Aug. 2, 2018

Related U.S. Application Data

(60) Provisional application No. 62/170,756, filed on Jun. 4, 2015.

(51) Int. Cl.
| | | |
|---|---|---|
| *C09B 47/10* | (2006.01) | |
| *C09D 11/322* | (2014.01) | |
| *C09B 67/50* | (2006.01) | |
| *G03F 7/00* | (2006.01) | |
| *C09D 11/037* | (2014.01) | |
| *C09D 7/41* | (2018.01) | |
| *C09B 47/24* | (2006.01) | |
| *C09B 67/00* | (2006.01) | |

(52) U.S. Cl.
CPC ............ *C09B 47/10* (2013.01); *C09B 47/24* (2013.01); *C09B 67/0026* (2013.01); *C09B 67/0032* (2013.01); *C09D 7/41* (2018.01); *C09D 11/037* (2013.01); *C09D 11/322* (2013.01); *G03F 7/0007* (2013.01)

(58) Field of Classification Search
CPC ..... C09B 47/10; C09B 67/0026; C09B 47/24; C09B 67/0032; C09D 11/322; C09D 7/41; C09D 11/037; G03F 7/0007
See application file for complete search history.

(56) References Cited

U.S. PATENT DOCUMENTS

| | | | |
|---|---|---|---|
| 2,910,482 A | 10/1959 | Gottlieb | |
| 3,300,512 A | 1/1967 | Gerson et al. | |
| 3,320,276 A | 5/1967 | Hamilton et al. | |
| 3,770,765 A * | 11/1973 | Jaffe | C09B 47/067 540/136 |
| 3,772,048 A * | 11/1973 | Rhodes | C09B 67/0033 106/410 |
| 4,948,884 A | 8/1990 | Nonaka et al. | |
| 5,282,896 A * | 2/1994 | Tsuchida | C09B 67/0035 106/411 |
| 5,449,774 A * | 9/1995 | Lambie | C09B 67/002 106/31.73 |
| 5,556,966 A | 9/1996 | Kimura et al. | |
| 5,725,649 A * | 3/1998 | Marr | C09B 69/04 106/411 |
| 5,772,750 A * | 6/1998 | Tomiya | C09B 67/0026 106/413 |
| 5,944,887 A * | 8/1999 | Schutze | C09B 67/0016 106/411 |
| 6,379,450 B1 * | 4/2002 | Willis | C09B 67/0016 106/410 |
| 6,826,001 B2 * | 11/2004 | Funakura | G02B 5/223 252/586 |
| 7,323,046 B1 | 1/2008 | Wolf et al. | |
| 2004/0250734 A1 * | 12/2004 | Shiromaru | C09B 67/0016 106/412 |

(Continued)

FOREIGN PATENT DOCUMENTS

| | | |
|---|---|---|
| CN | 101717401 | 6/2010 |
| CN | 102516813 A | 6/2012 |
| CN | 103048882 A | 4/2013 |

(Continued)

OTHER PUBLICATIONS

Aravindakshan, A., "Copper Phthalocyanines," Paint & Coatings Industry (PCI), Jan. 2005, 13 pgs.
Hilton, W., "Various Salt Attritted Monochlor Crudes," SunChemical Technical Service Report: E13-019, date of publication unknown, 2 pgs.
Shigemitsu, M., "Studies on Copper Phthalocyanine and its Chlorinated Derivatives Based upon the X-ray Diffraction Patterns," Bulletin of the Chemical Society of Japan, 1959, 32(6):607-616.
International Search Report and Written Opinion for PCT Application No. PCT/US2016/035392, 11 pages, [dated 2016].
Huanshun et al., "Synthesis of Metal Phthalocyanine by Solid-State Method," Dyestuffs Coloration 41(3): 150-152 (2004); English translation.

(Continued)

*Primary Examiner* — Anthony J Green
(74) *Attorney, Agent, or Firm* — Frost Brown Todd LLC

(57) ABSTRACT

It is an object of the present technology to overcome the disadvantages of conventional chlorination of a copper phthalocyanine which produces copper phthalocyanine, wherein the number of chlorines is less than or equal to 4. The pigments described herein contain less chlorine than standard commercial grades of tetrachlorinated (or greater) copper phthalocyanine pigments while achieving similar color space, chromaticity, fastness properties, and color travel in automotive waterborne and solvent borne systems. The inventive pigments are more advantageous from a toxicity and environmental perspective, and allow the manufacturer to produce pigments in a safe and economical manner.

10 Claims, 2 Drawing Sheets

(56) References Cited

U.S. PATENT DOCUMENTS

2004/0260083 A1* 12/2004 Shiromaru .......... C09B 67/0016
540/130
2013/0004746 A1* 1/2013 Patel ................... C09B 47/0671
428/195.1

FOREIGN PATENT DOCUMENTS

| EP | 0635550 | | 1/1995 | |
|----|---------|---|---------|---|
| EP | 0761770 | | 3/1997 | |
| EP | 1956051 | | 8/2008 | |
| GB | 1120530 | A | 7/1968 | |
| JP | S62158284 | | 7/1987 | |
| JP | 2001270885 | | 10/2001 | |
| JP | 4407097 | | 6/2003 | |
| JP | 2003176423 | | 6/2003 | |
| JP | 2003176424 | | 6/2003 | |
| JP | 2010-189528 | A | 9/2010 | |
| JP | 2010-533745 | A | 10/2010 | |
| JP | 5229819 | | 10/2010 | |
| JP | 2013-079399 | A | 5/2013 | |
| JP | 5481873 | B2 | 4/2014 | |
| JP | 2016023223 | A * | 2/2016 | ............ C09B 67/20 |
| RU | 2164233 | | 3/2001 | |

OTHER PUBLICATIONS

Moser et al., "Phthalocyanine compounds." Journal of Chemical Education 41.5 (1964): 245; pp. 172-179.

* cited by examiner

CHLORINATED COPPER PHTHALOCYANINE PIGMENTS

CROSS-REFERENCE TO RELATED APPLICATIONS

This application claims priority to U.S. provisional application No. 62/170,756, entitled, "Chlorinated Copper Phthalocyanine Pigments," filed Jun. 4, 2015, which is incorporated by reference herein in its entirety.

BACKGROUND

Phthalocyanine compounds are highly stable 18 π-electron-conjugated macrocycles that exhibit intense, bright colors, and are represented by the following general formula:

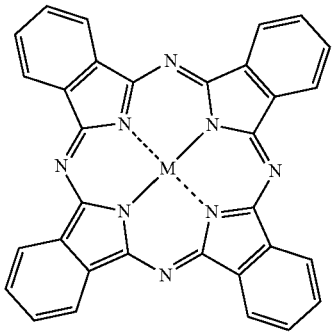

Phthalocyanines, which include metal-phthalocyanine coordination compounds (i.e., M is an atom or atoms capable of bonding to the central cavity of a phthalocyanine molecule and can have the capability to attach axial ligands) and metal-free phthalocyanines (i.e., M is H), are frequently used as dyes or pigments in the textile and paper industries, and have also been used as chemical sensors, photodynamic cancer drugs, nonlinear optical materials, catalysts and liquid crystals.

Phthalocyanines may be formed upon heating a phthalic acid derivative, such as phthalic anhydride, phthalimide, phthalonitrile or o-cyanobenzamide, with a nitrogen source, such as urea, in cases where the phthalic acid derivative does not itself contain sufficient nitrogen. The synthesis of metal phthalocyanine coordination compounds additionally requires the presence of an appropriate metal derivative. Metal phthalocyanines are commonly synthesized following one of two methods. One common method utilizes either phthalimide or phthalic anhydride (as a precursor to phthalimide) as the starting material, while the other method starts with phthalonitrile. Both methods involve the simultaneous synthesis of the ligand with formation of the metal complex.

In general, to synthesize a metal phthalocyanine from phthalic anhydride, phthalic anhydride is heated with urea, a metal halide such as aluminum(III) chloride ($AlCl_3$) and a small amount of a catalyst, such as a molybdenum compound, in a high-boiling solvent, with urea acting as the source of nitrogen. The presence of the catalyst is essential in these reactions to catalyze the formation of a key intermediate, 1-amino-3-iminoiso-indoline. The use of phthalic anhydride as the starting material in the synthesis of the metal phthalocyanine pigment chloroaluminum phthalocyanine is described in Huanshun et al., "Metal phthalocyanine solid phase synthesis," Ranliao Yu Ranse 41(3):150-152 (2004); Chinese Patent No. CN101717401; Japanese Pub. Nos. JP 2003-176424, JP 2003-176423; Japanese Patent No. JP 4407097; and U.S. Pat. No. 6,826,001. These procedures all involve the use of catalytic quantities of molybdenum, typically ammonium molybdate, molybdic oxide, or another similar molybdenum compound.

The other method commonly used to synthesize metal phthalocyanines starts with phthalonitrile and involves heating the phthalonitrile to around 200° C. with a metal halide such as $AlCl_3$, with or without a solvent. For example, a process to synthesize chloroaluminum phthalocyanine using $C_1$-$C_{10}$ alcohols, for example ethanol, as the solvent gave only 68% yield (RU 2164233), and a method that involves heating phthalonitrile in water at 180° C. in the presence of $AlCl_3$ is described as violently vigorous and resulted in only a 70% yield (JP 62-158284). Much lower yields were obtained when the reaction also involved the use of ammonia. A complex of ammonia and aluminum chloride was allowed to form before heating with phthalonitrile, resulting in a 47% yield of the chloroaluminum phthalocyanine (JP 2000-1270885).

As an alternative to the two methods described above, metal phthalocyanines also can be prepared by substitution (i.e., transmetallation) reactions. For example, chloroaluminum phthalocyanine can be prepared from a different metal phthalocyanine, such as copper phthalocyanine. In these reactions, the metal (e.g., copper) is replaced with aluminum by heating copper phthalocyanine in molten $AlCl_3$ and NaCl to 240° C. for six hours (EP 0 635 550 and U.S. Pat. No. 5,556,966). However, the final product may contain unreacted copper phthalocyanine, thus raising similar environmental concerns as the phthalocyanines prepared using metal catalysts.

It is well known that the shade of copper phthalocyanines varies according to the number of chlorine atoms present in the molecule. Thus, the blue shade of the non-chlorinated copper phthalocyanine changes to green-blue when 8 chlorine atoms are introduced and to a more intense green shade ("phthalocyanine green") when 12 or more chlorine atoms are incorporated into the copper phthalocyanine molecule.

Chlorinated metal phthalocyanines have been produced by a variety of methods. Liquid halogenating agents include sulfuryl chloride and thionyl chloride. Such halogen agents as aluminum chloride are used in limited quantities, but the bulk of the reaction medium consists of the liquid halogenating agent. In other words, the halogenating agent is dependent upon to supply the liquid medium for the reaction.

A typical procedure for the preparation of phthalocyanine green uses large amounts of expensive reagents as solvents such as chlorosulfonic acid, which are then discarded after the reaction is complete. Such processes are expensive due both to the waste of the discarded solvent and to long reaction times required to make the chlorinated phthalocyanines.

Moser and Thomas, Phthalocyanine Compounds, pages 172-179, Reinhold Publishing Corporation, New York (1963), disclose the use of copper chloride as a catalyst for chlorinating copper phthalocyanine. However, it does not disclose the use of copper chloride in a process involving the reaction of the copper phthalocyanine with sulfuryl chloride.

U.S. Pat. No. 3,320,276 teaches that sulfuryl chloride will halogenate a metal-free phthalocyanine or a metal complex of phthalocyanine such as copper phthalocyanine without the addition of elemental halogen in the presence of aluminum chloride and/or aluminum bromide and, preferably, containing an alkali metal halide such as sodium chloride with sulfur monochloride present as a halogen carrier. However, this process requires the aluminum chloride or aluminum bromide be in the form of a fluid melt. This has many disadvantages since it requires means for heating and maintaining the aluminum chloride in a fluid state. Large quantities of the aluminum chloride are required in this process, for example, all the examples call for 100 parts of anhydrous aluminum chloride for 10 parts of copper phthalocyanine. Further, the hydrolyzed aluminum chloride (at the end of the reaction) is discarded and may contribute to effluent problems.

Generally, phthalocyanine has been industrially halogenated by a method in which phthalocyanine is halogenated while it is dissolved in a eutectic salt of aluminum chloride and sodium chloride or a method in which phthalocyanine is halogenated while it is dissolved in chlorosulfonic acid. In these methods, however, it is industrially difficult to recover the solvent, and as a result, a large amount of an acidic effluent is caused. For environmental protection, the effluent should be treated, and a large cost is required for the treatment. As a halogenation method using a recoverable solvent in order to cope with the above problem, there have been disclosed methods using a metal chloride as a solvent. For example, JP-A-52-29819 and U.S. Pat. No. 4,948,884 disclose a method of halogenating phthalocyanine in a titanium tetrachloride as a solvent.

A need exists for an efficient process for synthesizing minimally chlorinated phthalocyanine pigments and pigment compositions, such as minimally chlorinated metal phthalocyanine pigments, wherein the number of chlorine atoms is less than 4, and also minimally chlorinated copper phthalocyanine pigments, where the average number of chlorines in the pigment composition is 1, thereby minimizing negative environmental impact.

BRIEF SUMMARY

It is an object of the present technology to overcome the disadvantages of conventional chlorination of metal phthalocyanines, and prepare metal (copper) phthalocyanines containing fewer chlorine atoms than the at least tetrachlorinated, copper phthalocyanine pigments. The present technology is directed to pigments, primarily in the β phase, containing less chlorine than standard tetrachlorinated copper phthalocyanine pigments, while giving similar color space, chromaticity, fastness properties, and color travel in automotive waterborne and solvent borne systems. These pigments are more advantageous from a toxicity and environmental perspective, and allow the manufacturer to produce pigments in a safe and economical manner.

DETAILED DESCRIPTION

The present technology relates to a chlorinated copper phthalocyanine pigment in the β crystal form, which is the major phase of this pigment, and of general Formula (I), wherein the degree of substitution is represented by $0.4 \leq m+n \leq 4$ $m \geq n$ $n > 0.2$ where m represents the average number of chlorine substituents at the α-position, and n represents the average number of chlorine substituents at the β-position.

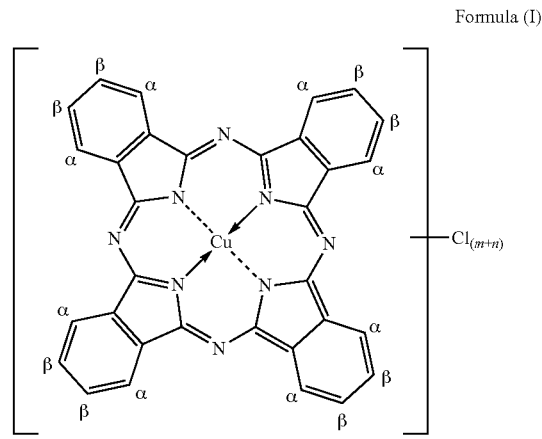

Formula (I)

The chlorinated copper phthalocyanine pigments, on average, may contain 1 chlorine atom, such as a monochlorinated copper phthalocyanine pigment. These chlorinated phthalocyanine pigments are thought to be safer, less toxic, and pose less of an environmental impact than highly chlorinated phthalocyanine pigments containing at least 4 chlorine atoms. The pigments in the present technology are of mixed crystal forms, mostly α and β forms and primarily β form. The β crystal form is the major phase, which comprises at least 50% of the crystal form. These pigments give rise to similar color space, chromaticity, lightfastness, and color travel in automotive paint systems as compared to standard (tetrachlorinated and greater) copper phthalocyanine pigments.

The subject chlorinated copper phthalocyanine pigments may be prepared by existing phthalocyanine synthetic procedures and offer the pigment manufacturer a more cost-effective means to prepare pigment products with properties similar to a standard tetrachloro-copper phthalocyanine pigment without the supply and capital investments related to handling and using chlorine gas.

The preferred process for synthesizing these chlorinated copper phthalocyanine pigments is the phthalic anhydride—urea process (Wyler Method), but the synthesis is not limited to any particular method. The chlorinated copper phthalocyanine pigment particle size and shape may be affected by the synthesis process, the selection of the reaction media during the synthesis step, and the subsequent finishing steps (e.g. autoclaving, salt attrition, ball milling, acid swelling, etc.).

Figure 1:
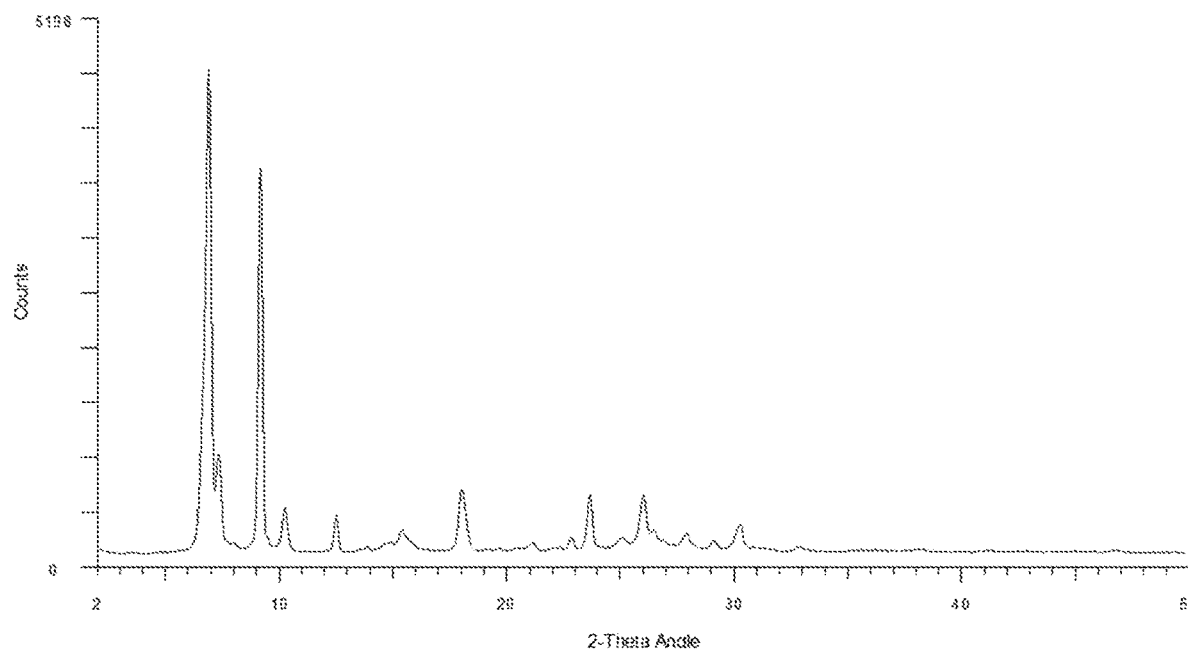
FIG. 1: X-ray Diffraction Pattern of Chlorinated Copper Phthalocyanine (m=0.71; n=0.29)—"Crude #1" in Example 1
Figure 2:
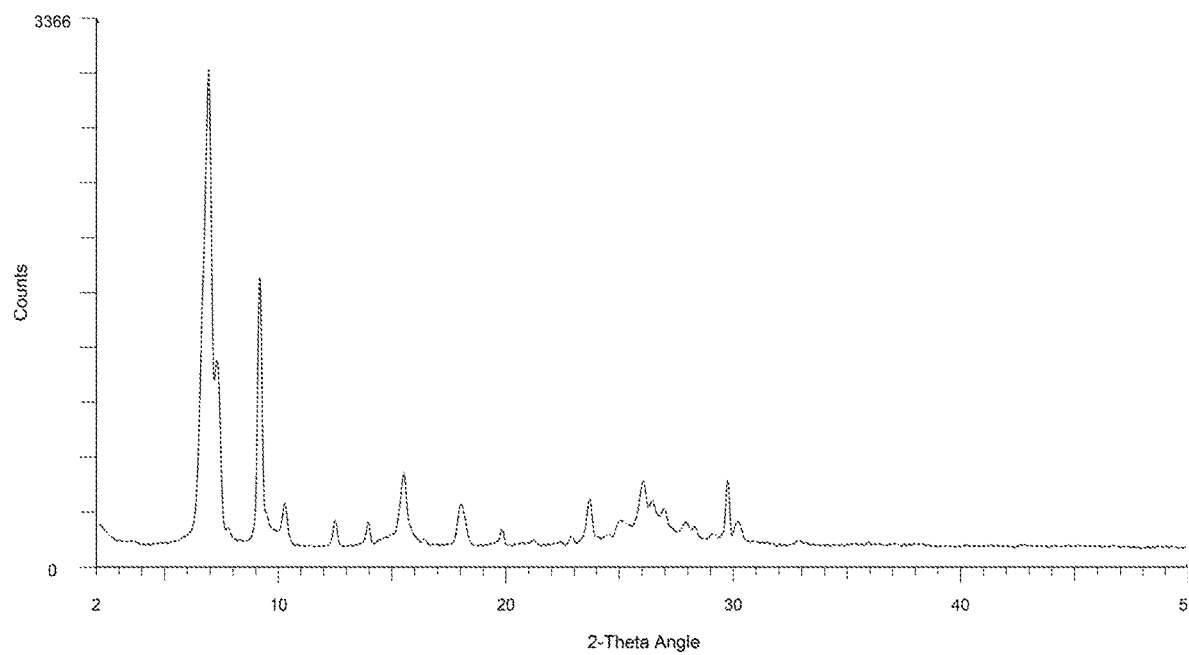
FIG. 2: X-ray Diffraction Pattern of Chlorinated Copper Phthalocyanine (m=0.60; n=0.40)—"Crude #2" in Example 2

X-ray powder diffraction patterns were obtained using a Siemens D5000 Diffractometer with graphite-monochromated Cu Kα$_1$ radiation (λ=1.5406 Å). The powder pigment sample was tightly packed in a 2"×2" standard sample holder. The sample holder was then loaded to the X-ray Diffractometer for analysis. The instrument was calibrated by using a quartz standard from Bruker AXS, Inc. (P/N C72298A227B36). The X-ray diffraction peaks are understood to be within experimental bounds and can result in slightly different peaks. It is also understood that other test methods could produce different peaks. Tables 1 and 2 summarize the X-ray diffraction patterns of "Crude #1" and "Crude #2" as produced in Examples 1 and 2, which are complicated mixed crystals of all possible chlorinated copper phthalocyanine compounds yielded from the reactions. The values given in the Table are those with relative intensity ≥5% and d≥2.5 Å. FIGS. 1 and 2 illustrate the X-ray diffraction pattern.

TABLE 1

X-ray Data of Chlorinated Copper Phthalocyanine (m = 0.71; n = 0.29) - "Crude #1" in Example 1

| d (Å) | Intensity |
|---|---|
| 12.99 | very strong |
| 12.20 | medium |
| 9.73 | strong |
| 8.71 | weak |
| 7.10 | weak |
| 5.76 | very weak |
| 4.93 | medium |
| 4.20 | very weak |
| 3.89 | very weak |
| 3.76 | weak |
| 3.55 | very weak |
| 3.42 | weak |
| 3.37 | very weak |
| 3.19 | very weak |
| 3.06 | very weak |
| 2.95 | very weak |

TABLE 2

X-ray Data of Chlorinated Copper Phthalocyanine (m = 0.60; n = 0.40) - "Crude #2" in Example 2

| d (Å) | Intensity |
|---|---|
| 13.52 | strong, sh |
| 12.94 | very strong |
| 12.25 | medium |
| 11.47 | very weak |
| 9.72 | strong |
| 8.67 | weak |
| 7.11 | very weak |
| 6.37 | very weak |
| 5.73 | weak |
| 5.40 | very weak |
| 4.93 | weak |
| 4.48 | very weak |
| 4.19 | very weak |
| 3.89 | very weak |
| 3.75 | weak |
| 3.54 | very weak |
| 3.42 | medium |
| 3.37 | weak |
| 3.30 | weak |
| 3.19 | very weak |
| 3.15 | very weak |
| 3.06 | very weak |
| 3.00 | medium |
| 2.96 | very weak |

The methods provided herein produce an on-average, a copper phthalocyanine pigment composition that is mono-chlorinated and the β crystal form is the major phase. The mono-chlorinated pigment compositions may be suitable for coatings (such as automotive paints), plastics, printing inks, waterborne or solvent borne pigment preparations, electrophotographic toners and developers, powder coating materials, inks, preferably ink-jet inks, color filters, and coloring seed.

Phthalocyanine derivatives may also be included within the scope of this technology and comprise the pigment particle. Phthalocyanine derivatives include, but are not limited to, phthalocyanine sulfonamides, phthalimidomethyl phthalocyanine, alkoxylated phthalocyanine derivatives, phthalocyanine sulfonic acids ("sulfonated phthalocyanine") and their salts.

The present technology has been described in detail, including the preferred embodiments thereof. However, it will be appreciated that those skilled in the art, upon consideration of the present disclosure, may make modifications and/or improvements on this technology that fall within the scope and spirit of the technology.

EXAMPLES

The following examples illustrate specific aspects of the present technology and are not intended to limit the scope thereof in any respect and should not be so construed.

These examples describe the preparation and use of the compositions of this technology. Pigments prepared according to these examples were analyzed by X-Ray diffraction (Siemens D5000 Diffractometer). The preferred process for synthesizing these chlorinated copper phthalocyanine pigments is the phthalic anhydride-urea process (Wyler Method) with an ammonium dimolybdate catalyst.

The term "pigment/pigmentary" as used herein refers to a phthalocyanine reaction product that has been treated or further processed after isolation from the reaction mixture in order to develop the requisite pigmentary properties, such as, e.g., particle size, such as between about 20 nm to 90 nm or between about 30 to 70 nm particle size distribution, particle shape, crystal structure, agglomeration, polymorphic phase and tinctorial strength. Treatment or further processing of a phthalocyanine reaction product to obtain a pigmentary phthalocyanine product can include milling, grinding or purifying, or any combination thereof.

Particle size distributions of the pigments described below were measured by a Disc Centrifuge Photosedimentometer (DCP) Size Analyser (Brookhaven Instruments Corporation) and are provided in Table 3.

DCP Measurement Procedure: DCP Measurement Procedure:

Working dispersions for DCP analysis were prepared first via mulling of pigment dry powder with dispersant Nuosperse W-28 in a ratio of 1:2 (Pigment:Dispersant). The resulting paste was then dispersed in deionized water with a ratio of 1:100 using an ultrasonic bath followed by an ultrasonic horn. The measurement was conducted on a Brookhaven BI-DCP particle size analyzer using a disc speed of 10,000 RPM at room temperature. Brookhaven BI-DCP software version 5.87 was used for data processing and particle size calculation.

TABLE 3

Particle Size Data for Pigments 1, 2 and 3.

| Sample ID | $D_w$ | $D_1$ | $D_5$ | $D_{10}$ | $D_{30}$ | $D_{50}$ | $D_{70}$ | $D_{90}$ | $D_{95}$ | $D_{99}$ |
|---|---|---|---|---|---|---|---|---|---|---|
| Pigment #1 | 57 | 19 | 23 | 26 | 34 | 45 | 62 | 105 | 131 | 200 |
| Pigment #2 | 43 | 17 | 20 | 22 | 29 | 35 | 43 | 69 | 95 | 206 |
| Pigment #3 | 48 | 17 | 20 | 22 | 29 | 37 | 51 | 90 | 115 | 182 |

Example 1: Preparation of Chlorinated Copper Phthalocyanine (m=0.71; n=0.29)

In a 1-L resin flask, 92.8 g of phthalic anhydride, 27.2 g of 3-chlorophthalic anhydride, 11.0 g of 4-chlorophthalic anhydride, 163.5 g of urea, 20.7 g of copper(I) chloride, 0.5 g of ammonium dimolybdate, and 705 g of dichlorotoluene were heated to 200° C. with agitation. The reaction was allowed to stir for 2 hr. at 200° C. After this time, the contents were cooled to room temperature and the solvent was removed in vacuo. The crude residue was allowed to stir in 2500 g of water and 100 g of concentrated sulfuric acid for 2 hr. at 90° C. The crude presscake was isolated by filtration, washed to conductivity less than 100 μmhos/cm, dried, and then homogenized in an Osterizer mixer. The obtained blue crude (Crude #1) was verified by X-ray analysis (Table 1, FIG. 1). Crude #1 (27 g) was then attrited with salt (216 g) and propylene glycol (53 g) in a laboratory kneader at 80° C. for 6 hr. At the completion of the attrition, the mixture was suspended in water, agitated at ambient temperature, and concentrated HCl was added until the slurry had a pH<1.0. The slurry was then heated to 90° C., held for 1 hr., and then filtered. The pigment was isolated by filtration, washed to a conductivity less than 100 μmhos/cm, dried, homogenized in an Osterizer mixer, and passed through a 60-mesh screen to afford a finished product (Pigment #1). Pigment #1 and the standard (Palomar® Blue 248-4816) were dispersed in a DuPont waterborne paint system for 3 hours on a Skandex shaker with a Pigment/Binder of 8.83/3.19. The paint formulation containing Pigment #1 and the standard were sprayed on panels in a temperature-controlled and moisture-controlled spray booth. The equipment inside of the spray booth is called an Automatic Test Panel Spray Machine (Spraymation, Inc.).

Table 4 shows the CIE L*a*b* data of the panels in 50 Aluminum (DuPont 50% Aluminum waterborne paint system [ratio of aluminum/pigment in the paint film is 50/50, formulated from product code: 54-47166 and pigment]). Data for the 50 Aluminum was obtained using an X-Rite MA-68 multi-angle spectrophotometer. The data in Table 3 shows that Pigment #1 is close in hue and lightness to the standard, has better chroma than the standard, and has an essentially neutral color travel as indicated by the travel (ΔH=0.3). The term "color travel" refers to a change in apparent color value of a metallic paint film when measured from a 15° to 110° viewing angle. The term "travel delta hue (Travel ΔH)" used herein refers to a difference in hue between the 15° measurement and the 110° measurement. When there is no difference between the two measurements (i.e., Travel ΔH=0), the down travel is said to be "neutral." The smaller the travel ΔH, the better the appearance of the paint. The data in Table 3 confirms that the inventive monochlorinated copper phthalocyanine pigment may be an alternative to commercially available tetrachloro copper phthalocyanine pigments, and is more advantageous from a safety, toxicity and environmental perspective.

TABLE 4

CIE L*a*b* Data for Pigment #1 Relative to Standard in 50 Aluminum (ΔH, ΔC, ΔL and ΔE are not adjusted to equal strength)

| Pigment | Angle | ΔH | ΔC | ΔL | ΔE | Δa | Δb |
| --- | --- | --- | --- | --- | --- | --- | --- |
| 248-4816* | Std | Std | Std | Std | Std | Std | Std |
| Pigment #1 | 15° | 4.5 | 4.4 | 0.8 | 6.3 | −0.2 | −6.3 |
|  | 25° | 3.6 | 2.4 | −1.1 | 4.5 | 0.8 | −4.3 |
|  | 45° | 4.0 | 0.8 | −2.5 | 4.8 | 2.7 | −3.0 |
|  | 75° | 4.3 | 1.5 | −1.7 | 4.8 | 3.5 | −2.9 |
|  | 110° | 4.8 | 2.6 | −1.0 | 5.6 | 4.3 | −3.4 |
|  | Travel |  |  | ΔH = 0.3 ΔL = −1.8 |  |  |  |

*The standard is Palomar® Blue 248-4816, a commercially available PB 15:1 from Sun Chemical.

TABLE 5

Color Data (Absolute Values) for Pigment #1: CIE L*a*b* Data for Pigment #1 Relative to Standard in 95W Tints (Sprayed Panels)

| Pigment | H | *C | *L | *a | *b |
| --- | --- | --- | --- | --- | --- |
| 248-4816 | 231.5 | 37.8 | 62.9 | −23.6 | −29.6 |
| Pigment #1 | 235.6 | 40.6 | 62.1 | −22.9 | −33.5 |

Example 2: Preparation of Chlorinated Copper Phthalocyanine (m=0.60; n=0.40)

In a 1-L resin flask, 92.8 g of phthalic anhydride, 22.6 g of 3-chlorophthalic anhydride, 15.5 g of 4-chlorophthalic anhydride, 163.5 g of urea, 20.7 g of copper(I) chloride, 0.5 g of ammonium dimolybdate, and 705 g of dichlorotoluene were heated to 200° C. with agitation. The reaction was allowed to stir for 2 hr. at 200° C. After this time, the reaction mixture cooled to room temperature and the solvent was removed in vacuo. The residue was allowed to stir in 2800 g of water and 100 g of concentrated sulfuric acid for 2 hr. at 90° C. The pigment was isolated by filtration, washed to conductivity less than 100 μmhos/cm, dried, and then homogenized in an Osterizer mixer. The obtained blue crude (Crude #2) was verified by X-ray analysis (Table 2, FIG. 2). Crude #2 (37.5 g) was ball milled in a stainless steel jar for 6 hr. at ambient temperature. The jar contained ~870 g of ¼ inch balls and ~97 g of small nails. The ball milled crude (31 g) was then attrited with salt (248 g) and propylene glycol (61 g) in a laboratory kneader at 80° C. for 6 hr. At the completion of the attrition, the mixture was suspended in water, agitated at ambient temperature, and concentrated HCl was added until the slurry had a pH<1.0. The slurry was then heated to 90° C., held for 1 hr., and then filtered. The pigment was isolated by filtration, washed to a conductivity less than 100 μmhos/cm, dried, homogenized in an Osterizer mixer, and passed through a 60-mesh screen to afford a finished product (Pigment #2). Pigment #2 and the standard (Palomar® Blue 248-4816) were dispersed in a DuPont waterborne paint system for 3 hours on a Skandex shaker with a Pigment/Binder of 8.83/3.19. The paint formulation containing Pigment #2 and the standard were sprayed on panels in a temperature-controlled and moisture-controlled spray booth. The equipment inside of the spray booth is called an Automatic Test Panel Spray Machine (Spraymation, Inc.).

Table 6 shows the CIE L*a*b* data of the panels in 50 Aluminum (DuPont 50% Aluminum waterborne paint system [ratio of aluminum/pigment in the paint film is 50/50, formulated from product code: 54-47166 and pigment]). Data for the 50 Aluminum was obtained using an X-Rite MA-68 multi-angle spectrophotometer. The data in Table 4 shows that Pigment #2 has chroma similar to the standard and has an essentially neutral color travel as indicated by the travel ($\Delta H=-0.9$). This data confirms that the inventive monochlorinated copper phthalocyanine pigment may be an alternative to commercially available tetrachlor copper phthalocyanine pigments, and is more advantageous from a safety, toxicity and environmental perspective.

TABLE 6

CIE L*a*b* Data for Pigment #2 Relative to Standard in 50 Aluminum ($\Delta H$, $\Delta C$, $\Delta L$ and $\Delta E$ are not adjusted to equal strength)

| Pigment | Angle | $\Delta H$ | $\Delta C$ | $\Delta L$ | $\Delta E$ | $\Delta a$ | $\Delta b$ |
|---|---|---|---|---|---|---|---|
| 248-4816* | Std | Std | Std | Std | Std | Std | Std |
| Pigment #2 | 15° | 6.3 | −0.6 | −6.5 | 9.1 | 4.9 | −4.0 |
|  | 25° | 6.4 | −1.0 | −5.0 | 8.2 | 5.4 | −3.6 |
|  | 45° | 6.2 | −0.1 | −2.9 | 6.9 | 5.3 | −3.3 |
|  | 75° | 5.6 | 1.0 | −1.8 | 5.9 | 5.0 | −2.6 |
|  | 110° | 5.4 | 1.5 | −1.4 | 5.8 | 5.1 | −2.3 |
|  | Travel | | | $\Delta H = -0.9$ $\Delta L = 5.1$ | | | |

*The standard is Palomar® Blue 248-4816, a commercially available PB 15:1 from Sun Chemical.

TABLE 7

Color Data (Absolute Values) for Pigment #2: CIE L*a*b* Data for Pigment #2 Relative to Standard in 95W Tints (Sprayed Panels)

| Pigment | H | *C | *L | *a | *b |
|---|---|---|---|---|---|
| 248-4816 | 232.1 | 36.9 | 61.2 | −22.6 | −29.1 |
| Pigment #2 | 238.9 | 36.7 | 59.3 | −18.9 | −31.4 |

The following example describes the preparation and use of the compositions of this technology. Pigments prepared according to these examples were analyzed by X-Ray diffraction (Siemens D5000 Diffractometer).

Example 3: Preparation of Chlorinated Copper Phthalocyanine (m=0.71; n=0.29) (PMV-00156-121/PMV-00156-125)

In a 1-L resin flask, 92.8 g of phthalic anhydride, 27.2 g of 3-chlorophthalic anhydride, 11.0 g of 4-chlorophthalic anhydride, 163.5 g of urea, 10.4 g of copper(I) chloride, 16.7 g of copper(II) sulfate, 0.5 g of ammonium dimolybdate, and 485 g of light branched alkylbenzene solvent were heated to 200° C. with agitation. The reaction was allowed to stir for 2.5-3 h at 200° C. After this time, the contents were cooled to room temperature and the solvent was removed in vacuo. The crude residue was allowed to stir in 2500 g of water and 100 g of concentrated sulfuric acid for 2 h at 90° C. The crude presscake was isolated by filtration, washed to conductivity less than 100 µmhos/cm, dried, and then homogenized in an Osterizer mixer. The obtained blue crude (Crude #3) was verified by X-ray analysis. Crude #3 (27 g) was then attritted with salt (216 g) and propylene glycol (52 g) in a laboratory kneader at 80° C. for 6 h. At the completion of the attrition, the mixture was suspended in water, agitated at ambient temperature, and concentrated HCl was added until the slurry had a pH<1.0. The slurry was then heated to 90° C., held for 1 h, and then filtered. The pigment was isolated by filtration, washed to a conductivity less than 100 µmhos/cm, dried, homogenized in an Osterizer mixer, and passed through a 60-mesh screen to afford a finished product. Pigment #3 and the standard (Palomar® Blue 248-4816) were dispersed in a DuPont waterborne paint system for 3 hours on a Skandex shaker with a Pigment/Binder of 8.83/3.19. The paint formulation containing Pigment #3 and the standard were sprayed on panels in a temperature-controlled and moisture-controlled spray booth. The equipment inside of the spray booth is called an Automatic Test Panel Spray Machine (Spraymation, Inc.).

Table 8 shows the CIE L*a*b* data of the panels in 50 Aluminum (DuPont 50% Aluminum waterborne paint system [ratio of aluminum/pigment in the paint film is 50/50, formulated from product code: 54-47166 and pigment]). Data for the 50 Aluminum was obtained using an X-Rite MA-68 multi-angle spectrophotometer. The data in Table 5 shows that Pigment #3 has chroma similar to the standard and has an essentially neutral color travel as indicated by the travel ($\Delta H=1.1$). This data confirms that the inventive monochlorinated copper phthalocyanine pigment may be an alternative to commercially available tetrachlor copper phthalocyanine pigments, and is more advantageous from a safety, toxicity and environmental perspective.

TABLE 8

CIE L*a*b* Data For Pigment #3 Relative to Standard in 50 Aluminum ($\Delta H$, $\Delta C$, $\Delta L$ and $\Delta E$ are not adjusted to equal strength)

| Pigment | Angle | $\Delta H$ | $\Delta C$ | $\Delta L$ | $\Delta E$ | $\Delta a$ | $\Delta b$ |
|---|---|---|---|---|---|---|---|
| 248-4816[1] | Std | Std | Std | Std | Std | Std | Std |
| Pigment #3 | 15° | 3.9 | 3.9 | −5.8 | 8.0 | −0.6 | −5.6 |
|  | 25° | 4.2 | 1.5 | −7.1 | 8.4 | 1.7 | −4.1 |
|  | 45° | 4.1 | −0.6 | −7.4 | 8.5 | 3.5 | −2.2 |
|  | 75° | 4.2 | −0.2 | −5.5 | 6.9 | 3.9 | −1.6 |
|  | 110° | 5.0 | 0.7 | −3.9 | 6.4 | 4.6 | −2.1 |
|  | Travel | $\Delta H = 1.1$ | | $\Delta L = 1.8$ | | | |

[1]The standard is Palomar® Blue 248-4816, a commercially available PB 15:1 from Sun Chemical.

TABLE 9

Color Data (Absolute Values) for Pigment #3: CIE L*a*b* Data for Pigment #3 Relative to Standard in 95W Tints (Sprayed Panels)

| Pigment | H | *C | *L | *a | *b |
|---|---|---|---|---|---|
| 248-4816 | 230.8 | 35.0 | 65.1 | −22.1 | −27.1 |
| Pigment #3 | 233.4 | 38.9 | 61.9 | −23.1 | −31.2 |

What is claimed is:

1. A chlorinated copper phthalocyanine pigment composition, comprising a mono-chlorinated copper phthalocyanine which is in a mixed crystal form containing α crystal form and β crystal form, and comprises greater than 50% β crystal form, wherein the mono-chlorinated copper phthalocyanine has structure:

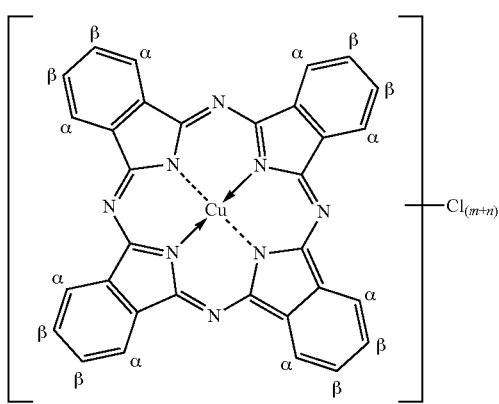

having α- and β-positions, where chlorine substitution at the α- and β-positions on the phthalocyanine is defined by:

$m+n=1$ $m \geq n$ $n > 0.2$ where m represents the average number of chlorine substituents at the α-position, and n represents the average number of chlorine substituents at the β-position.

2. The phthalocyanine pigment composition of claim 1, having a particle size between about 20-90 nm.

3. The phthalocyanine pigment composition of claim 1, having a particle size between about 30-70 nm.

4. The phthalocyanine pigment composition of claim 1, having a hue angle (H) in 95 W tints between about 225-242°.

5. The phthalocyanine pigment composition of claim 1, wherein the pigment composition comprises at least one additive.

6. The phthalocyanine pigment composition of claim 5, wherein the additive is a pigment derivative.

7. The phthalocyanine pigment composition of claim 6, wherein the additive is a modified phthalocyanine pigment derivative.

8. The phthalocyanine pigment composition of claim 7, wherein the additive is a sulfonated phthalocyanine pigment derivative.

9. The phthalocyanine pigment composition of claim 1, wherein the pigment composition is used in automotive paint systems.

10. A coating, ink, waterborne or solvent borne pigment preparation, electrophotographic toner and developer, plastics, color filters, powder coating materials, comprising the chlorinated copper phthalocyanine pigment composition of claim 1.

* * * * *